US006380727B1

United States Patent
Jitaru

(10) Patent No.: US 6,380,727 B1
(45) Date of Patent: Apr. 30, 2002

(54) CURRENT SENSOR

(75) Inventor: Ionel Jitaru, Tucson, AZ (US)

(73) Assignee: Ascom Energy Systems AG, Berne (CH)

(*) Notice: Subject to any disclaimer, the term of this patent is extended or adjusted under 35 U.S.C. 154(b) by 0 days.

(21) Appl. No.: 09/113,794

(22) Filed: Jul. 3, 1998

(51) Int. Cl.$^7$ ............................................. G01R 33/00
(52) U.S. Cl. ..................... 324/117 R; 324/127; 336/200
(58) Field of Search .......................... 324/117 H, 127, 324/654, 117 R; 361/699; 327/511; 336/200, 232

(56) References Cited

U.S. PATENT DOCUMENTS

| | | | |
|---|---|---|---|
| 4,893,073 A | * 1/1990 | McDonald et al. | ..... 324/117 H |
| 5,004,974 A | * 4/1991 | Cattaneo et al. | ........ 324/117 R |
| 5,416,407 A | * 5/1995 | Drafts | ..................... 324/117 H |
| 5,736,846 A | * 4/1998 | Floru et al. | .................. 324/127 |

* cited by examiner

Primary Examiner—Christine Oda
Assistant Examiner—Suhash Zaveri
(74) Attorney, Agent, or Firm—Birdwell, Janke & Durando, PLC

(57) ABSTRACT

A current sensing cell, using PCB trace-loops, with the loops either contained in a single layer—horizontal loops, or in two separate layers—vertical loops interconnected by vias into a single two-pole inductive component. The horizontal loop-sensor cell will be used sideways, next to a planar conductor carrying a current parallel to the sensor traces, so as to collect the magnetic field lines on the side of the planar conductor, where they come closer together. The vertical loop sensor cell will be used on top or bottom of a planar conductor carrying current parallel to the cell, so as to collect the magnetic field lines going across the conductor, or between two parallel conductors, carrying parallel current of opposite sense, so as to collect the magnetic field lines that run in between the two conductors, summing up the two fields.

9 Claims, 5 Drawing Sheets

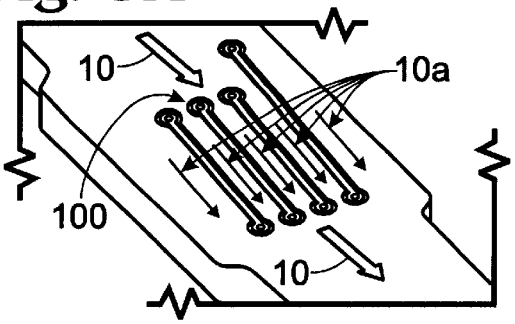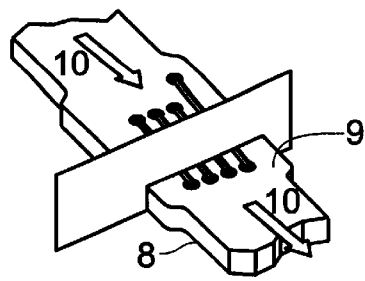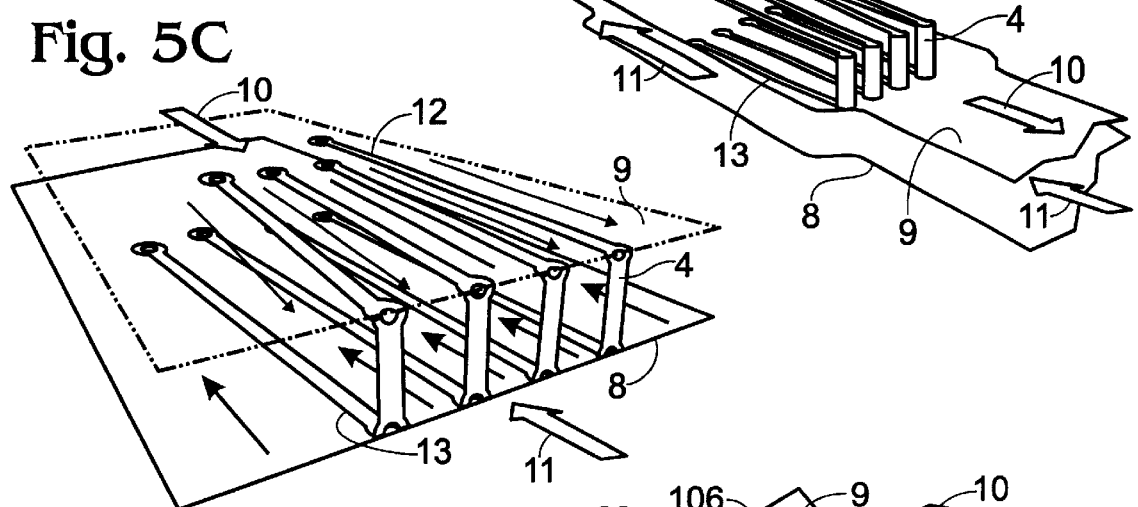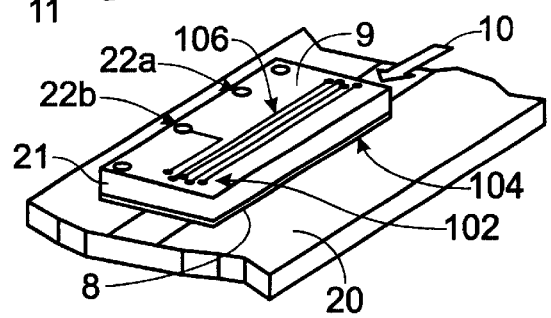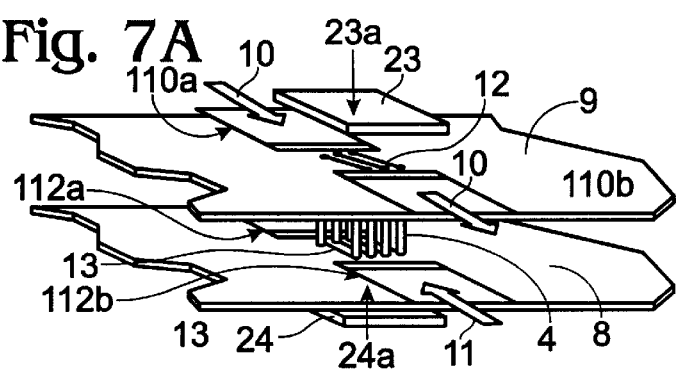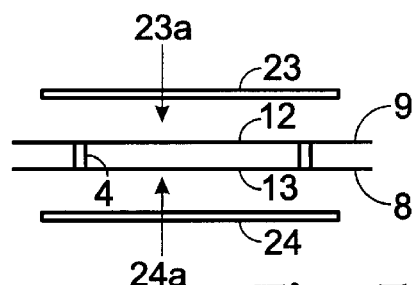

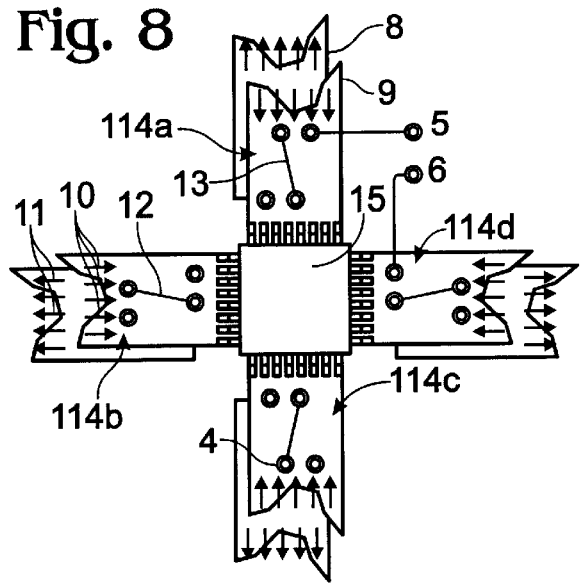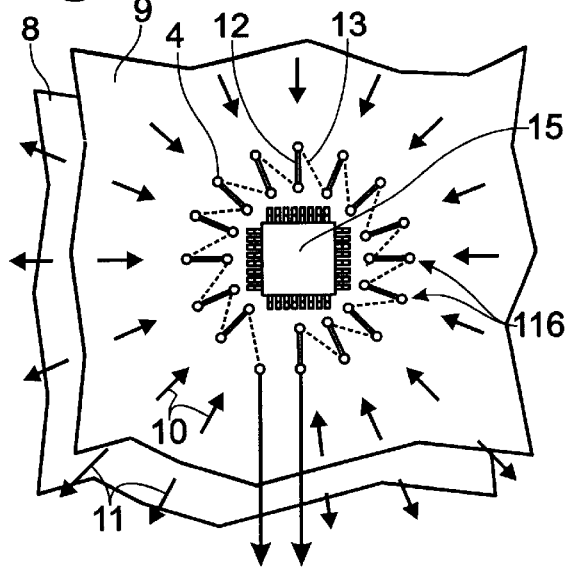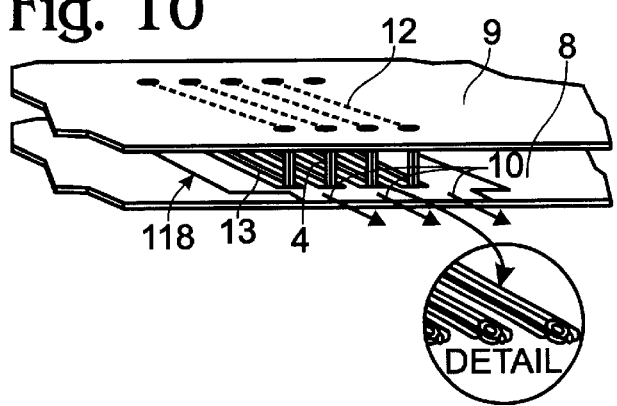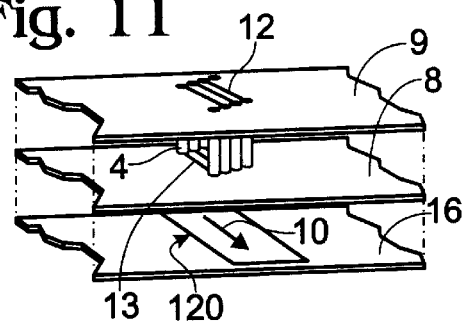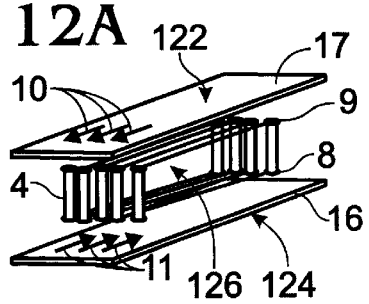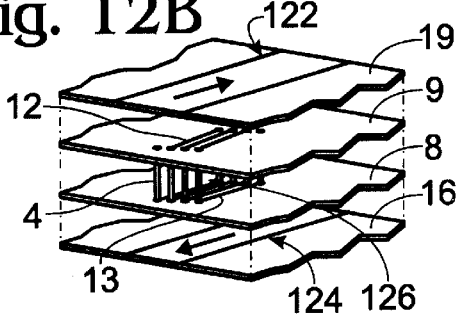

Fig. 17
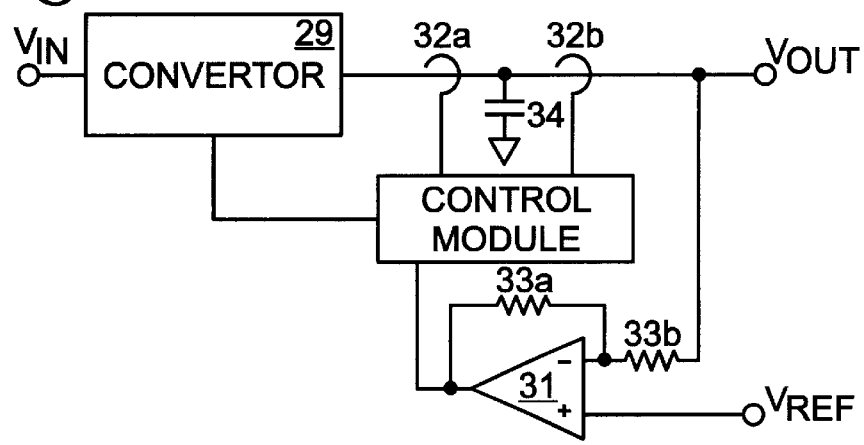
Fig. 18A
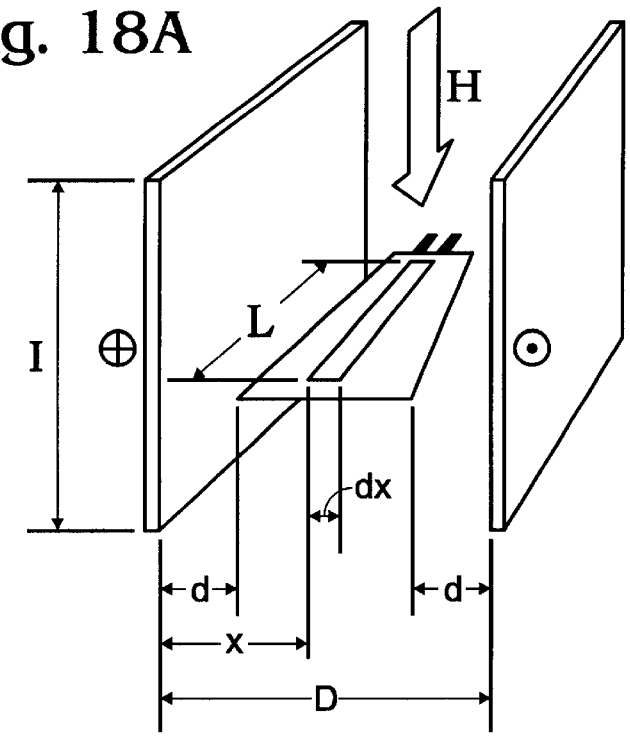
Fig. 18B
$$e = -\frac{\mu L}{\pi}\left[\frac{2(D-2d)}{1}\operatorname{arctg}\frac{1}{2(D-2d)} - \frac{2d}{1}\operatorname{arctg}\frac{1}{2d} - \ln\frac{d}{D-2d} + \frac{1}{2}\ln\frac{\frac{1^2}{4(D-2d)^2}+1}{\frac{1^2}{4d^2}+1}\right]\frac{dI(t)}{dt}$$

CURRENT SENSOR

BACKGROUND OF THE INVENTION

1. Field of the Invention

The present invention relates to a current sensor, specifically to a sensor which will detect an AC current, or a fast variation of a DC current, and will produce a signal proportional to this variation.

2. Description of the Prior Art

The methods and devices used for current detection by prior art, are based on the Rogowski Pickup Coil, presented in FIG. 1. This sensor comprises a coil 27, inserted between two conductors 25 and 26, each carrying opposite sense currents 10 and 11, one of each is wrapped around the coil, so as to offer a better magnetic coupling with the coil. The variable magnetic field generated by the conductors, will generate a signal into the coupled coil. This layout implies a very difficult manufacturing process, with many parts involved, like the coil, a support for the coil, an insulator, a cylindrically formed conductor, and a case to hold them all together.

SUMMARY OF THE INVENTION

The main object of this invention is to provide a very versatile, easy to manufacture, extremely compact, low cost current sensor, especially for high currents, and which will not interfere in any way with the current flow, which will not draw power or dissipate almost none of the energy offered by the system. The present invention is an inductance, designed in a vertical and a horizontal layout, which is used to collect magnetic field lines from the field generated by the current carrying conductor, both the inductive sensor and the conductor being PCB copper traces, on a PCB board. Thus, the sensor will not practically be a discrete component to be mounted on the PCB, but will be manufactured as part of the interconnection layout of the electronic application (schematics) with little if any cost added to the total cost of the electronic PCB board. The sensor will produce a signal, which will be proportional to ramp of variation of the current in the main conductor. The sensor may be positioned in two places when dealing with single current conductors: the sensor may be located either on top/bottom of the planar conductor, crossing/collecting the field lines which pass across the conductor, or sideways, collecting the more close together field lines in this area. When dealing with two parallel conductors, carrying opposite sense currents, the sensor will be placed between the two conductors, with the traces parallel to these conductors, collecting the field lines of both conductors, which will be packed together in between the conductors. In most of the applications the current carrying conductor and the return current path plane are located in very close to each other to minimize the parasitic inductance. The magnetic field is concentrated in between these to planes. The sensor loop is located in between these planes wherein the magnetic field lines are concentrated. This is the layout offering the highest output signal. The number of loops and the number of necessary layers will depend upon the application, the available space and the current slope.

BRIEF DESCRIPTION OF THE DRAWINGS

FIG. 5A shows a perspective view of another embodiment of the present invention, also on a two-layer PCB, but with a "comb" like inter-twinning of the sensor and the conductive copper layer, on both sides.

FIG. 5B shows a cross section plane positioned on the previous setup.

FIG. 5C shows a 3-dimensional view of the cross section of the previous embodiment for a clearer view of the bottom layer.

FIG. 5D shows the same structure from % A, 5B and 5C from a different perspective.

FIG. 6 shows another embodiment of the present invention, with the current sensor of a completely separate PCB board, on top of the current carrier strip.

FIG. 7A is another embodiment of the present invention, where the two conductive layers are interrupted, on both sides, to make room for the current sensor, and a bypass conductive element which is mechanically and electrically attached to the conductive layers for carrying the current above the sensor.

FIG. 7B presents the same thing from a front view angle.

FIG. 8 shows another embodiment of the present invention, with a two-layer PCB, an integrated circuit which acts as a load on the top layer (for. ex. a microprocessor), four conductors supplying in-coming current to it, on the bottom layer the same four traces carrying out-going current, and series connected sensor loops (each of them with a structure similar to the embodiment presented in FIG. 4 or FIG. 5), totaling an unique sensor, on both layers.

FIG. 9 shows another embodiment of the present invention with the same setup like the one in FIG. 8, but with continuous copper-conductive layers, and a continuous sensor loop like the embodiment presented in FIG. 5, surrounding the load and sensing the current which goes to the load.

FIG. 10 shows another embodiment of the present invention, with only one conductive layer and the sensor using the same layer, and the layer above.

FIG. 11 shows another embodiment of the present invention, with the conductor carrying the current, and the sensor, each on separate layers, the sensor above the conductor.

FIG. 12A shows another embodiment of the present invention, with a four-layer setup, the sensor using the two layers between the two conductive layers.

FIG. 12B shows the same as 12A but in a different perspective.

FIG. 17 shows an optimum dynamic response converter employing in the control section the information obtained from the current sensor located before and after the storage element.

FIG. 18A shows a preferred embodiment of this invention wherein a current sense loop is located in between two conductors caring identical current in opposite direction.

FIG. 18B shows the formula to calculate the voltage induced in the sensor loop depicted in FIG. 18A.

DESCRIPTION OF THE PREFERRED EMBODIMENTS

Figure 1:
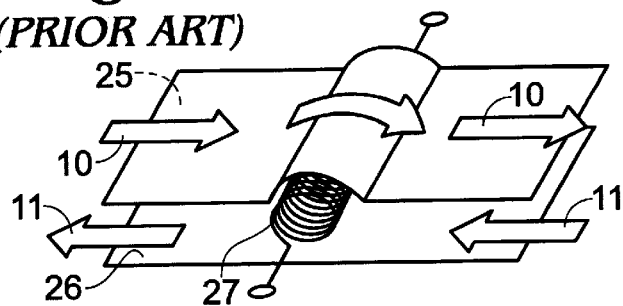
FIG. 1 is a perspective view of the prior art principle used for detecting high current surges.
Figure 2:
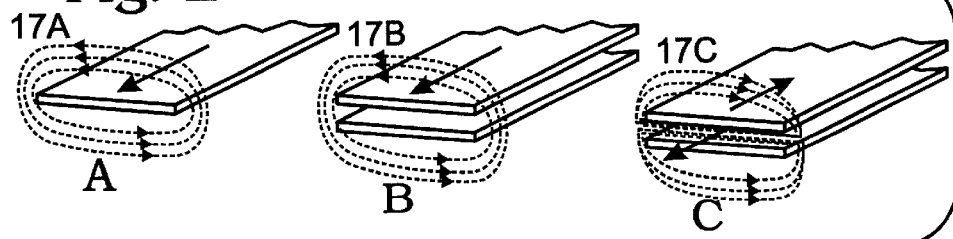
FIG. 2 shows the magnetic field lines surrounding a planar conductor carrying a current (A), two planar parallel conductors carrying electrical currents of the same direction and sense (B), and two planar parallel conductors carrying electrical currents of the same direction, but opposite sense (C).
Figure 3:
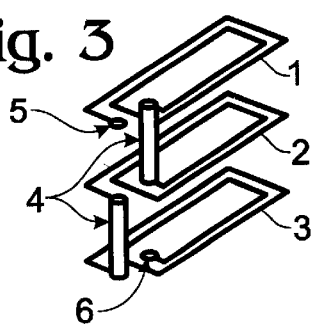
FIG. 3 shows a perspective view of three planar coils, two turns each, on three parallel planes, interconnected through vertical vias, to form a bobbin.
Figure 4A:
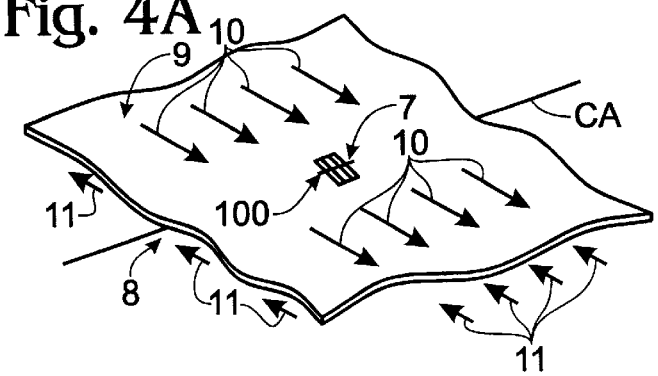
FIG. 4A shows a 3-dimensional view of a part of a two-layer PCB, with parallel and opposite currents on each layer, with a window type current sensor which is an embodiment of the present invention.
Figure 4C:
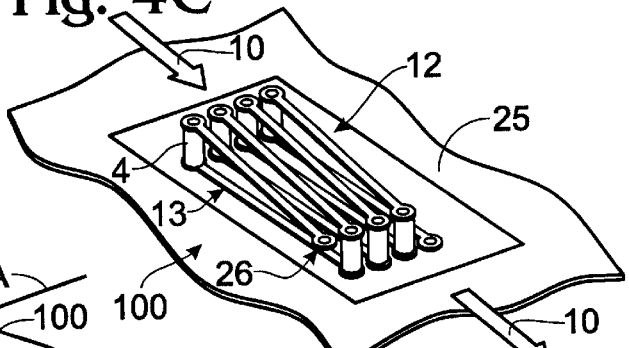
FIGS. 4B and 4C the same but in a close-up view.
Figure 4B:
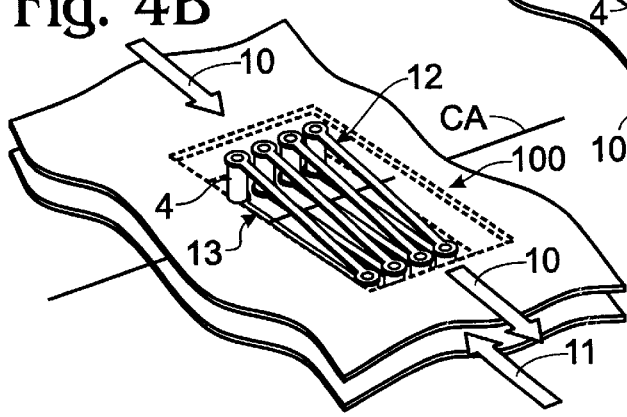

FIGS. 4A, 4B and 4C show a 3-dimensional view of a part of a two-layer PCB, with parallel and opposite currents on each layer, with the current sensor located in a narrow window to minimize the impact on the current flow; type which is an embodiment of the present invention. The current flow is similar to the principle shown in FIG. 2C, with parallel conductors, opposite currents, and the magnetic field lines cumulating and going straight between the two conductors. This is exactly the place where the current sensor will be placed, so as to collect all the lines passing through the length of the window. On a two-layer PCB, upper layer 9, and bottom layer 8, a window 7 is opened in each copper layer on top and on the bottom. This window is housing the current four-turn sensor loop. "The sensor comprises the upper layer traces 12, the bottom layer traces 13, and the vias 4, which interconnect the two trace-sets, forming a coil. Referring to FIGS. 4A and 4B, the coil has a coil axis CA that extends laterally with respect to the PCB, i.e., substantially along a direction that lies in a plane parallel to the surface of the PCB." The upper layer current flows in the direction shown by arrows 10, the bottom one in the opposite direction, shown by arrow 11. The sensor signal is collected from the pads 25 and 26. The voltage induced in the spiral created by traces 12, 13 and vias 4 is proportional with the number of turns, the area enclosed by the spiral and the derivative of the current. The advantage of this structure is the fact that it does not require additional layers for location of the current sensor. The sensing window shall be very small in comparison with the current carrying conductors not the impact the current flow. The traces can be located close to each other in order to increase the number of turns the giving window.

FIGS. 5A, 5B, 5C and 5D, show a perspective view of another embodiment of the present invention, also on a two-layer PCB, but with a "comb" like inter-twinning of the sensor and the conductive copper layer, on both sides. We have the same two layers, 8 and 9, the two currents flowing in opposite directions shown by arrows 10 and 11, the upper traces 12 of the sensor 100, the bottom traces 13 and the vias 4. This time the sensor is not housed in a window-like area where the copper has been removed, but its traces are intertwined with current carrying traces. The current 10 is flowing through the space in between the top and bottom traces, current labeled 10a. This setup will also cumulate all magnetic field lines in between the two conductors.

FIG. 6 shows another embodiment of the present invention, with the current sensor, 106 of a completely separate PCB board, on top of the current carrier strip. This setup is collecting information from the magnetic field located on top of the current carrying conductor. The distribution of the magnetic field is presented in FIG. 2A. A PCB board carrying the current sensor, 21 are placed on top, and parallel to the current carrying copper strip, on a separate PCB board 20. The current flow is shown by the arrow 10. The upper side sensor traces 9, are connected also by vias 102 with the one on the bottom 8. The bottom side of the sensor board is protected with an insulator 104, not to be shortened by the current carrying strip. The input and output pads 22a and 22b of the sensor 106, will take the signal.

FIGS. 7A and 7B is another embodiment of the present invention, where the two conductive layers are interrupted, on both sides, to make room for the current sensor, and a bypass electrically conductive element 23 and 24, is carrying the current above and underneath of the sensor 106. The embodiment uses the principle setup presented in FIG. 2C, wherein the magnetic field is concentrated in between the current conductive planes. We have the same two-layer PCB board, upper layer 9 bottom layer 8, and two parallel strips of conductor copper, interrupted to make room for the sensor. The upper current will flow in the direction 10, will bypass the sensor flowing through the strip 23 and will continue on the upper layer 9 in the same direction. The strip 23 is shown here in an elevated position, so as the sensor will be visible; for normal functioning position it will be let down, as the arrow 23a shows, until it makes mechanically and electrically contact with the two semi-strips on the top layer 110a and 100b. The same applies for the bottom layer 8, the interrupted strip carrying the current in the direction 11, using the strap 24, which will have to be displaced as arrow 24a shows, to make contact with the tow bottom semi strips, 112a and 112b.

FIG. 8 shows another embodiment of the present invention, with a two-layer PCB, an integrated circuit 15, on the top layer (for. ex. a microprocessor), four conductors supplying in-coming current to it 10, and on the bottom layer the same four traces carrying out-going current 11, and series connected sensor loops 114a, 114b, 114c and 114d (each of them with a structure similar to the embodiment presented in FIG. 4 or FIG. 5), totaling an unique sensor, on both layers. The IC 15 is powered by the incoming current on the top layer 9 direction 10a, 10b, 10c, 10d, the current going out through the bottom layer 8, in directions 11a, 11b, 11c, 11d. Each strip houses a sensor of the type presented in FIG. 5 and all the sensors will by connected in a series layout, the signal being collected through pads 5 and 6. Two sets of conductors or only one set can replace these four sets of conductors. The number of such sets of conductors can be higher than four. The idea is to split the current going to the IC, 15, in order to minimize the power dissipation in the conductors and reduce the parasitic inductance between the current source and the load, 15.

FIG. 9 shows another embodiment of the present invention with the same setup like the one in FIG. 8, but with continuous copper-conductive layers, and a continuous sensor loop like the embodiment presented in FIG. 5. Since the incoming current on the top layer 9, will be provided to the IC 15 through a ring-type copper continuous layer, and the outgoing current will be collected from the IC in a similar way, the unit currents will flow parallel with the unit sensor loops 12 (top) and 13 (bottom), collecting the generated magnetic filed lines. This construction it is preferable in applications wherein the current demands by the 15 changes very fast and the parasitic elements between the power source and the load have to be minimized. The implementation of the current sensor, 116, can be done in different ways as presented in FIG. 4, FIG. 5 or FIG. 12.

FIG. 10 shows another embodiment of the present invention, with only one conductive layer and the sensor using the same layer, and the layer above. The current sensor is build on the upper layer 9 with the traces 12, and on the bottom layer 8 with the traces 13, connected together by the vias 4. The current flows through the bottom copper strip 118, in the direction indicated by the arrows 10. The setup collects the magnetic filed lines on top of the conductor.

FIG. 11 shows another embodiment of the present invention, with the conductor carrying the current, and the sensor, each on separate layers, the sensor above the conductor. This setup uses three layers 9, 8, and 16 the sensor being build on layer 9 with the traces 12, and layer 8 with the traces 13, interconnected by vias 4. Layer 16 is used for the location of the current strip 120, to carry the current in the direction 10.

FIGS. 12A and 12B shows another embodiment of the present invention, with a four-layer setup, the sensor using the two layers, 8 and 9 between the two conductive layers, 16 and 17. The layers 17 and 16 carry opposite current through the conductive strips 122 and 124. The magnetic field created by the current 10 and 11 is concentrated in between layers 17 and 16. Part of this magnetic field will link the loop implemented on layer 8 and 9. The voltage develop across the sensor loop 126 will supply information about the rate of change of the currents 10 and 11.

Figure 13A:
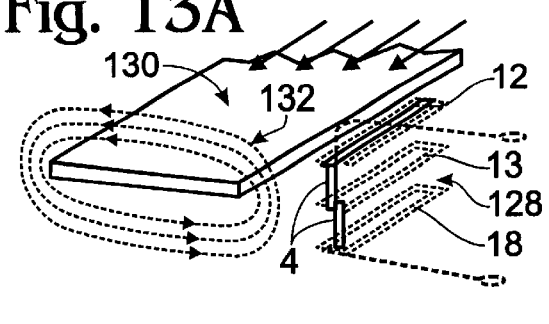
FIGS. 13A and 13B shows another embodiment of the present invention, with a side-setup, a three layer current sensor and one layer conductor, parallel to the sensor.
Figure 13B:
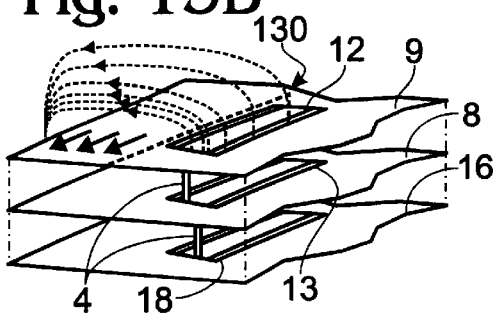

FIGS. 13A and 13B shows another embodiment of the present invention, with a side-setup, a three-layer current sensor 128 and one layer conductor 130, parallel to the sensor 128. The sensor is positioned sideways so as to collect the filed lines 132 in the area where they are closer together. The current flows in the direction 10, the sensor uses the layers 9, 8 and 16, and consists of three double-turn loops, 12, 13 and 18, interconnected by vias 4 into a single sensor. The current 10 is flowing through the conductive strip 130 located on layer 9.

Figure 14:
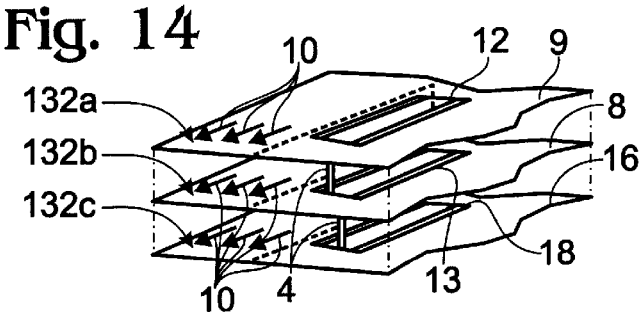
FIG. 14 shows another embodiment of the present invention, with a three-layer setup for both the sensor and the conductor, each layer having a conductor and a two-turns-loop sensor.

FIG. 14 shows another embodiment of the present invention, with a three-layer setup for both the sensor and the conductor, each layer having a conductor and a two-turns-loop sensor. All conductors 132a, 132b and 132c, are located on layers, 9, 8 and respective 16. The conductors 132a, 132b and 132c carry currents of similar sense 10, so the resulting magnetic field will envelop the three conductors. The sensor loops, 12, 13 and 18, connected through the vias 4, will therefore be positioned sideways, where the lines are closer together.

Figure 15:
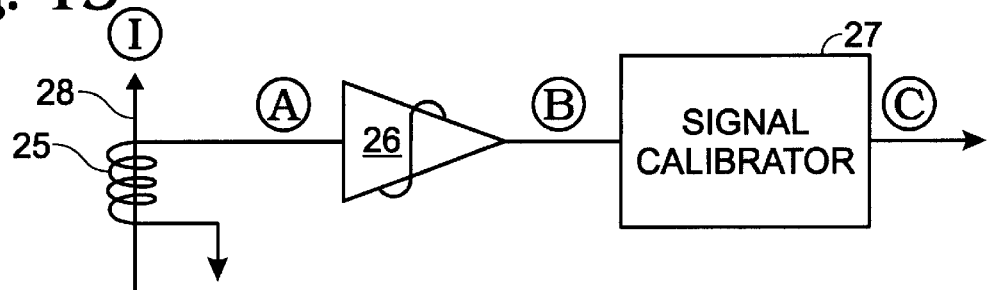
FIG. 15 shows another embodiment of the present invention where the signal from the current sense is further integrated and calibrated to obtain a signal identical to the current sensed.
Figure 16:
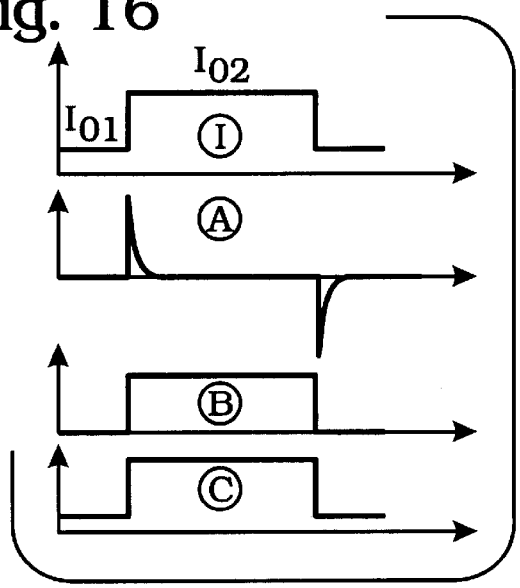
FIG. 16 shows the key waveforms from the structure depicted in FIG. 15.

FIG. 15 and FIG. 16 shows another embodiment of the present invention wherein the signal from the current sense is further integrated and calibrated to obtain a signal identical to the current sensed. The current sense 25 will produce a voltage proportional with the rate of change of the current 28. Further the signal A, it is integrated by the circuit 26, and a signal B is obtained. The signal B is a reconstruction of the current I, without the initial conditions. A special circuit 27 will do the calibration at the moment when the current I has a known value for example 0. The signal C represents the current 28, which was sensed by 25.

FIG. 17 Shows a optimum dynamic response converter employing in the control section the information obtained from the current sensor 32a located before and 32b located after the storage element 34. The Control module 30 processes the information obtained from 32a and 32b together with the information obtained from comparing the output voltage Vo with the reference Vref. The voltage error between Vo and Vr is further amplified by the ratio of 33a and 33b and sent to 30. The output signal from the Control Module 30 is further sent to the power converter 29. This optimum feedback loop monitors the changes of the current going in and out of 34 to be able to respond very fast to any load changes to maintain.

FIGS. 18A and 18B Shows a preferred embodiment of this invention wherein a current sense loop is located in between two conductors caring identical current in opposite direction. This drawing is instrumental in deriving the formula depicted in FIG. 18B. The formula presents the dependency of the voltage sensed by the loop function of the geometry of the loop, its location and the rate of change of the current flowing through the left and right plane.

What is claimed is:

1. A current sensor, comprising:
   a multi-layer printed circuit board having at least an upper layer and a lower layer;
   a first electrically conductive trace on said upper layer;
   a second electrically conductive trace on said lower layer; and
   at least one electrically conductive via interconnecting said first and second traces so as to form a coil having a coil axis extending laterally with respect to said circuit board, said coil having an output for coupling to a measurement circuit for measuring a magnetic field induced therein.

2. The current sensor of claim 1, further comprising a third electrically conductive trace above said upper layer for carrying a first current to be sensed by the current-sensing cell.

3. The current sensor of claim 2, wherein said third electrically conductive trace is oriented so that said first current flows in a direction that is substantially perpendicular to said axis.

4. The current sensor of claim 2, further comprising a fourth electrically conductive trace below said lower layer for carrying a second current to be sensed by the current-sensing device.

5. The current sensor of claim 4, wherein said second current is substantially equal to and flows in substantially the opposite direction as said first current.

6. A current sensor, comprising:
   a multi-layer printed circuit board;
   a first electrically conductive trace on a layer of said circuit board, said trace forming at least part of a coil, said coil having an output for measuring a magnetic field induced therein;
   a second electrically conductive trace disposed above said layer for carrying a first current; and
   a third electrically conductive trace disposed below said layer for carrying a second current, wherein said second current is substantially equal in magnitude to said first current arid flows in substantially the opposite direction.

7. The current sensor of claim 6, wherein the axis of said coil extends substantially laterally with respect to said circuit board.

8. The current sensor of claim 7, wherein said third electrically conductive trace is oriented so that said first current flows in a direction that is substantially perpendicular to said axis.

9. The current sensor of claim 6, wherein said third electrically conductive trace is oriented so that said first current flows in a direction that is substantially perpendicular to said axis.

* * * * *